United States Patent
Feng et al.

(10) Patent No.: US 10,833,502 B2
(45) Date of Patent: Nov. 10, 2020

(54) SYSTEM FOR CONTROLLING INRUSH CURRENT BETWEEN A POWER SOURCE AND A LOAD

(71) Applicant: HAMILTON SUNDSTRAND CORPORATION, Charlotte, NC (US)

(72) Inventors: Frank Z. Feng, Loves Park, IL (US); Randall Bax, Rockton, IL (US); Ryan W. Schmid, Rockford, IL (US); Huazhen (Harry) Chai, Caledonia, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 469 days.

(21) Appl. No.: 15/875,906

(22) Filed: Jan. 19, 2018

(65) Prior Publication Data

US 2019/0229527 A1    Jul. 25, 2019

(51) Int. Cl.
*H02H 9/02* (2006.01)
*H03K 17/567* (2006.01)
(Continued)

(52) U.S. Cl.
CPC .............. *H02H 9/02* (2013.01); *H02H 1/043* (2013.01); *H02H 9/001* (2013.01); *H02H 9/025* (2013.01);
(Continued)

(58) Field of Classification Search
CPC ......... H02H 1/043; H02H 9/001; H02H 9/025
See application file for complete search history.

(56) References Cited

U.S. PATENT DOCUMENTS

2002/0191426 A1    12/2002  Hussein
2008/0253154 A1*   10/2008  Schiene ................. H02M 1/42
                                                  363/50
(Continued)

FOREIGN PATENT DOCUMENTS

JP      08289546 A   * 11/1996
JP      H08289546      11/1996

OTHER PUBLICATIONS

Applicant submitted translation of JP 08-289546. Nov. 8, 1996. (Year: 1996).*

(Continued)

*Primary Examiner* — Jared Fureman
*Assistant Examiner* — Christopher J Clark
(74) *Attorney, Agent, or Firm* — Snell & Wilmer LLP (57) ABSTRACT

A system for controlling inrush current between a power source and a load includes an output capacitor coupled in parallel with the load, and a transistor having a gate, a collector configured to be coupled to the power source, and an emitter configured to be coupled to the load. The system also includes a supply resistor configured to be electrically coupled between the power source and the load and to provide a resistor charging current from the power source to the output capacitor to charge the output capacitor in response to initial power being provided by the power source. The system also includes a gate resistor having a first terminal coupled to the gate of the transistor to cause the transistor to operate in a linear mode in response to the initial power being provided by the power source to increase a speed of charging the output capacitor.

18 Claims, 3 Drawing Sheets

(51) Int. Cl.
*H02H 1/04* (2006.01)
*H02H 9/00* (2006.01)

(52) U.S. Cl.
CPC ... *H03K 17/567* (2013.01); *H03K 2217/0054* (2013.01)

(56) References Cited

U.S. PATENT DOCUMENTS

| | | | | |
|---|---|---|---|---|
| 2012/0026636 | A1* | 2/2012 | Chai | H02H 9/001 361/93.9 |
| 2013/0009624 | A1* | 1/2013 | Tagome | B60L 3/00 323/350 |
| 2013/0106328 | A1* | 5/2013 | Kopiness | H02M 1/36 318/400.11 |
| 2018/0316275 | A1* | 11/2018 | Yoshida | H02M 1/00 |
| 2018/0323608 | A1* | 11/2018 | Valdivia Guerrero | H03K 17/166 |

OTHER PUBLICATIONS

European Patent Office, European Search Report dated Sep. 27, 2019 in Application No. 19151886.9.

\* cited by examiner

SYSTEM FOR CONTROLLING INRUSH CURRENT BETWEEN A POWER SOURCE AND A LOAD

FIELD

The present disclosure is directed to systems and methods for controlling inrush current between a power source and a load.

BACKGROUND

Inrush current may refer to a relatively large surge of current that occurs when a device (i.e., load) is initially powered on via a power source. It is desirable to reduce or control the inrush current, especially if the load includes sensitive electronics, as the surge of current can damage sensitive parts. For example, it is desirable to reduce or control inrush current in aircraft systems due to the numerous sensitive electronic components utilized in such aircraft systems.

SUMMARY

Described herein is a system for controlling inrush current between a power source and a load. The system includes an output capacitor coupled in parallel with the load. The system also includes a transistor having a gate, a collector configured to be coupled to the power source, and an emitter configured to be coupled to the load. The system also includes a supply resistor configured to be electrically coupled between the power source and the load and to provide a resistor charging current from the power source to the output capacitor to charge the output capacitor in response to initial power being provided by the power source. The system also includes a gate resistor having a first terminal coupled to the gate of the transistor to cause the transistor to operate in a linear mode in response to the initial power being provided by the power source to increase a speed of charging the output capacitor.

Any of the foregoing embodiments may also include a controller coupled to the gate of the transistor and configured to identify a turn-on condition in response to determining that the load at least one of will be or is turning on; and control the transistor to operate in an on mode to allow a driving current to flow through the transistor to power the load in response to identifying the turn-on condition.

In any of the foregoing embodiments, the gate resistor has a second terminal coupled to the controller, and wherein the controller is further configured to control the transistor to operate in the on mode by applying an on mode voltage to the gate of the transistor via the gate resistor.

In any of the foregoing embodiments, the controller is further configured to identify a rapid charging condition in response to determining that rapid charging of the output capacitor is desirable; and control the transistor to operate in the linear mode by applying a linear mode voltage to the gate of the transistor via the gate resistor in response to identifying the rapid charging condition, the linear mode voltage being different than the on mode voltage.

In any of the foregoing embodiments, the controller is further configured to identify a slow charging condition in response to determining that slow charging of the output capacitor is desirable; and control the transistor to operate in an off mode to reduce the likelihood of any current flowing from the power source through the transistor to the output capacitor in response to identifying the slow charging condition.

In any of the foregoing embodiments, the controller is further configured to identify a turn-off condition in response to determining that the load at least one of will be or is turning off; and control the transistor to operate in an off mode or the linear mode to reduce the likelihood of the driving current flowing through the transistor to power the load in response to identifying the turn-off condition.

In any of the foregoing embodiments, the transistor is an insulated-gate bipolar transistor (IGBT).

In any of the foregoing embodiments, the supply resistor has a resistance value between 1 Kilo ohm and 1 Mega ohm.

In any of the foregoing embodiments, the output capacitor is a direct current (DC) link capacitor.

Also disclosed is a system for controlling inrush current between a power source and a load. The system includes an output capacitor coupled in parallel with the load. The system also includes a transistor having a gate, a collector configured to be coupled to the power source, and an emitter configured to be coupled to the load. The system also includes a supply resistor configured to be electrically coupled between the power source and the load and to provide a resistor charging current from the power source to the output capacitor to charge the output capacitor in response to initial power being provided by the power source. The system also includes a gate resistor having a first terminal coupled to the gate of the transistor. The system also includes a controller coupled to the transistor. The controller is designed to identify a charging condition in response to determining that charging of the output capacitor is desirable. The controller is also designed to control the transistor to operate in a linear mode in response to identifying the charging condition and in response to the initial power being provided by the power source to increase a speed of charging the output capacitor.

In any of the foregoing embodiments, the gate resistor has a second terminal coupled to the controller, and the controller is further configured to control the transistor to operate in the linear mode by applying a linear mode voltage to the gate of the transistor via the gate resistor.

In any of the foregoing embodiments, the controller is further configured to identify a turn-on condition in response to determining that the load at least one of will be or is turning on; and control the transistor to operate in an on mode to allow a driving current to flow through the transistor to power the load in response to identifying the turn-on condition.

In any of the foregoing embodiments, the controller is further configured to: identify a turn-off condition in response to determining that the load at least one of will be or is turning off; and control the transistor to operate in an off mode or the linear mode to reduce the likelihood of the driving current flowing through the transistor to power the load in response to identifying the turn-off condition.

In any of the foregoing embodiments, the gate resistor has a second terminal coupled to the controller, and the controller is further configured to control the transistor to operate in the on mode by applying an on mode voltage to the gate of the transistor via the gate resistor.

In any of the foregoing embodiments, the controller is further configured to identify a slow charging condition in response to determining that slow charging of the output capacitor is desirable; and control the transistor to operate in an off mode to reduce the likelihood of any current flowing from the power source through the transistor to the output capacitor in response to identifying the slow charging condition.

Also disclosed is a method for controlling inrush current between a power source and a load. The method includes identifying, by a controller, a charging condition in response to determining that charging of an output capacitor coupled to the load is desirable. The method also includes controlling, by the controller, a transistor coupled between the power source and the load to operate in a linear mode to provide a transistor charging current from the power source to the output capacitor in response to determining that charge of the output capacitor is desirable. The method also includes identifying, by the controller, a turn-on condition in response to determining that the load at least one of will be or is turning on. The method also includes controlling, by the controller, the transistor to operate in an on mode to allow driving current to flow through the transistor to power the load in response to identifying the turn-on condition, the driving current being greater than the transistor charging current.

In any of the foregoing embodiments, the transistor charging current is added to a resistor charging current corresponding to a supply resistor coupled between the power source and the load to generate a total charging current.

Any of the foregoing embodiments may also include identifying, by the controller, a slow charging condition in response to determining that slow charging of the output capacitor is desirable; and controlling, by the controller, the transistor to operate in an off mode such that the total charging current is provided by the resistor charging current.

Any of the foregoing embodiments may also include identifying, by the controller, a turn-off condition in response to determining that the load at least one of will be or is turning off; and controlling, by the controller, the transistor to operate in an off mode or the linear mode to reduce the likelihood of the driving current flowing through the transistor to power the load in response to identifying the turn-off condition.

Any of the foregoing embodiments may also include identifying, by the controller, a fully charged condition in response to determining that the output capacitor is fully charged; and controlling, by the controller, the transistor to operate in an off mode in response to identifying the fully charged condition.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosures, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical, chemical, and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
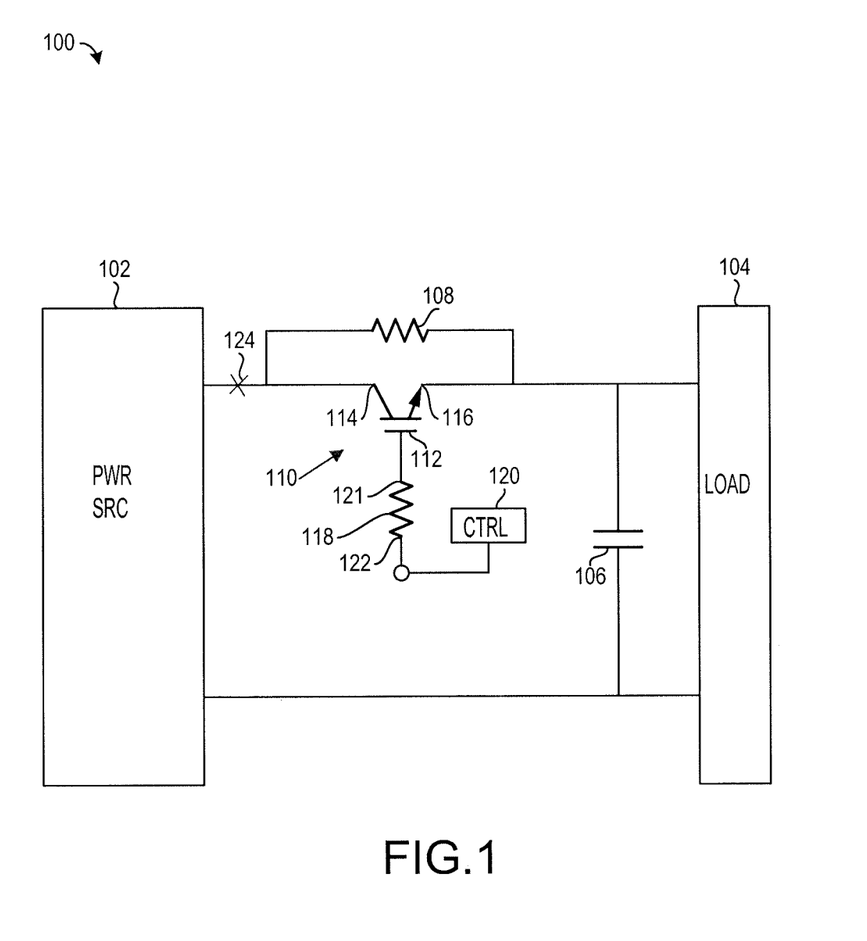
FIG. 1 is a schematic drawing illustrating a system for controlling inrush current between a power source and a load, in accordance with various embodiments of the present disclosure.

Referring to FIG. 1, a system 100 for controlling inrush current is shown. The system 100 may be designed to limit inrush current between a power source 102 and a load 104. The system 100 may include a supply resistor 108, a transistor 110, a gate resistor 118, a controller 120, and a current sensor 124. The system 100 may be used to protect sensitive equipment (the load 104 and/or the power source 102) from inrush current. For example, the system 100 may be implemented in an aircraft to protect equipment, such as brake control units or avionics units, from inrush current.

The power source 102 may include any power source capable of generating, storing, or outputting power to electronic components. The power source 102 may provide one or both of alternating current (AC) or direct current (DC) current. For example, the power source 102 may include a generator, a battery, or the like.

The load 104 may include any device or component that utilizes or transfers electrical energy. For example, the load 104 may include an inverter. In that regard, the power source 102 may provide DC power and the load 104 may include an inverter that converts the DC power into AC power.

The output capacitor 106 may include any capacitor or other electronic component that functions as a capacitor. For example, the output capacitor 106 may be a DC link capacitor. The output capacitor 106 may store a charge that may be used to power the load 104.

The supply resistor 108 may be used to charge the output capacitor 106. In that regard, in response to the power source 102 initializing (i.e., turning on, or providing initial power) current may flow through the supply resistor 108 and charge the output capacitor 106. This current may be referred to as resistor charging current as it is current that flows through the supply resistor 108 to charge the output capacitor 106. The charging time of the output capacitor 106 may be based on the resistance value of the supply resistor 108. As the resistance value of the supply resistor 108 increases, the charging time of the output capacitor 106 increases. However, as the resistance value of the supply resistor 108 increases, the likelihood of damage to the supply resistor 108 decreases (due to heat generated in response to current flowing through the supply resistor 108).

The transistor 110 may include any transistor or switch. In various embodiments, the transistor 110 may include an insulated-gate bipolar transistor (IGBT) due to desirable properties of IGBTs, such as parasitic resistance and capacitance values (such as the Miller capacitance effect).

The transistor 110 may include a gate 112, a collector 114, and an emitter 116. The collector 114 of the transistor 110 may be coupled to the power source 102 (and thus one terminal of the bypass resistor 108), and the emitter 116 of the transistor 110 may be coupled to the load 104 (and thus the output capacitor 106, the load 104, and the other terminal of the bypass resistor 108).

The gate resistor 118 may include any resistor and may have a first terminal 121 that is coupled to the gate 112 of the transistor 110. The gate resistor 118 may further have a second terminal 122. The second terminal 122 of the gate resistor 118 may be coupled to the controller 120. In that regard, the controller 120 may control operation of the transistor 110 by applying or removing a voltage to/from the gate 112 via the gate resistor 118.

The current sensor 124 may include any sensor capable of detecting at least one of a presence or an amplitude of current at a given location. The current sensor 124 may be capable of detecting current provided from the power source 102. Although the current sensor 124 is shown between the supply resistor 108 and the power source 102, the current sensor 124 may be located at any other location within the system 100 at which the current sensor 124 may detect current flowing between the power source 102 and the load 104.

The controller 120 may include a logic device such as one or more of a central processing unit (CPU), an accelerated processing unit (APU), a digital signal processor (DSP), a field programmable gate array (FPGA), an application specific integrated circuit (ASIC), or the like. In various embodiments, the controller 120 may further include any non-transitory memory known in the art. The memory may store instructions usable by the logic device perform operations, such as those illustrated in FIG. 2 herein.

Conventional inrush current limiting systems include a switch located between a power source and a load. Such conventional systems further include a resistor coupled between the power source and the load in parallel with the switch. In response to power being provided by a power source of conventional systems, the switch is held in an "off mode" (corresponding to a lack of current flowing through the switch) and all power flows through the resistor to charge an output capacitor. In response to the output capacitor being charged, switch is turned to an "on mode" (corresponding to a state in which a relatively large volume of current may flow through the switch), regardless of whether the load is turned on or not.

Due to the fact that the switches in such conventional systems switch to an on mode after charging of the capacitor, it has been assumed that the switch will turn to the on mode prior to the load being turned on. Thus, the resistors of conventional systems are selected to have a power rating sufficient to withstand the energy used to charge the capacitor, rather than a power rating sufficient to withstand the energy used to power a continuous load. For example, such resistors may have resistance values of 100 ohms or less. However, in various situations, the power supplies may be arbitrarily interrupted, or may even oscillate while the load is still utilizing power. These interruptions and oscillations may cause current to flow from the power supply to the load via the resistor (due to the switch being in the off mode), potentially resulting in failure of the resistor due to overheating.

In order to reduce the likelihood of failure of the supply resistor 108, the resistance value of the supply resistor 108 may be significantly greater than resistance values used in conventional inrush limiting circuits. For example, the resistance value of the supply resistor 108 may be between 500 ohms and 10 Mega ohms, between 1 Kilo ohm and 1 Mega ohms, or between 1 Kilo ohms and 500 Kilo ohms.

As described above, however, increased resistance of the supply resistor 108 may correspond to a decrease charging time of the output capacitor 106. In some situations, this delay is acceptable. However, in some situations, such a delay may be undesirable.

In that regard, the transistor 110 may be controlled to provide a transistor charging current which may then be added to the resistor charging current to provide a total charging current and used to charge the output capacitor 106.

Rather than controlling the transistor 110 to be in an on mode during the charging of the output capacitor 106, the controller 120 may control the transistor 110 to be in a linear mode. An amount of current allowed to flow through the transistor 110 in response to the transistor 110 being in the linear mode is less than the on mode. Inclusion of the gate resistor 118, along with the inherent properties of the transistor 110 (such as the Miller effect capacitance of an IGBT) facilitates operation of the transistor 110 in the linear mode.

Due to the relatively high resistance value of the supply resistor 108, the supply resistor 108 may be suitably rated for continuous loads. In that regard, the transistor 110 may remain in the off mode (or the linear mode) until the load 104 is at least one of turned on or preparing to be turned on (i.e., at least one of drawing power or preparing to drop power).

Before operation of the system 100, all components of the system 100 may be turned off. In that regard, the power source 102 is failing to generate power, the load 104 is failing to use power, and there may be a lack of current flowing through each component of the system 100.

As the power source 102 is turned on (i.e., power starts being provided by the power source), the current may flow from the power source 102 through the supply resistor 108 and begin charging the output capacitor 106 as the resistor charging current.

Simultaneous, or nearly simultaneous, with power source 102 being turned on, the current sensor 124 may detect that the power source 102 has begun providing power. The controller 120 may receive data from the current sensor 124 indicating that the power source 102 has begun providing this initial power. In response, the controller 120 may apply a linear mode voltage to the gate 112 of the transistor 110 to cause the transistor 110 to operate in the linear mode. In response to the gate 112 receiving the linear mode voltage, the transistor 110 may operate in the linear mode such that some current from the power source 102 flows through the transistor 110 to charge the output capacitor 106. This current may be referred to as the transistor charging current, as it is provided through the transistor 110. Providing the combination of the resistor charging current and the transistor charging current increases the speed of charging the output capacitor 106.

The current sensor 124 may likewise identify that the output capacitor 106 is charged in response to determining a lack of current flowing through current sensor 124. In response to identifying that the output capacitor 106 is charged, the controller 120 may control the transistor 110 to operate in the off mode (such as by reducing or eliminating the voltage applied to the gate 112).

After a period of time, the controller 120 may receive data (such as from the load 104 or from another source) indicating that the load 104 is or will be turning on (i.e., is or will be drawing power). In response to receiving this data, the controller 120 may apply the on mode voltage to the gate 112 to cause the transistor 110 to operate in the on mode, allowing a driving current to be applied to the load 104 from the power source.

An amplitude of the driving current (i.e., the current that is allowed to travel through the transistor 110 in response to the transistor 110 being in the on mode) is greater than an amplitude of the transistor charging current (i.e., the current that is allowed to travel through the transistor 110 in response to the transistor 110 being in the linear mode). In some embodiments, the linear mode voltage may be less than the on mode voltage. However, this depends upon the specific configuration of the transistor 110 and the accompanying components.

Figure 2:
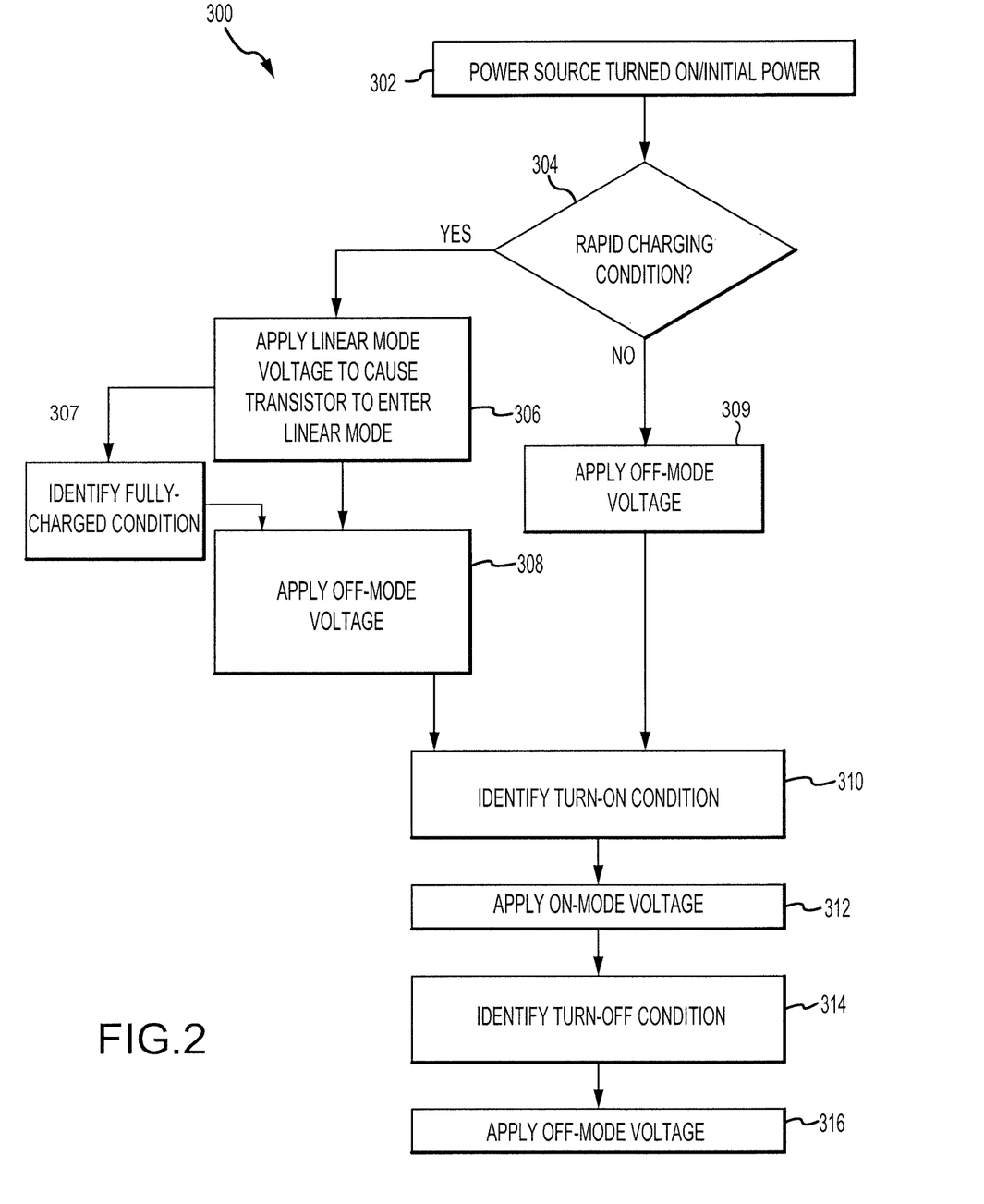
FIG. 2 illustrates a method for controlling inrush current between a power source and a load, in accordance with various embodiments of the present disclosure.

Referring now to FIG. 2, a method 300 for controlling inrush current between a power source and a load is shown. The method 300 may be performed by components of a system for controlling inrush current, such as components of the system 100 of FIG. 1. For example, various blocks of the method 300 may be performed by the controller 120 of the system 100 of FIG. 1.

In block 302, a power source may be turned on. Stated differently, in block 302, initial power may be provided by the power source. In various embodiments, a controller may identify that the power source has been turned on and initial power has been provided based on data detected by a current sensor.

In block 304, it may be determined whether a rapid charging condition (which may also be referred to as a charging condition) has been identified. For example, the controller may identify, via an input device or logic, that the load is likely to be turned on (i.e., drop power) within a relatively short amount of time, which may indicate a rapid charging condition. In some embodiments, the controller may be programmed to always or never identify a rapid charging condition. In some embodiments, a user may provide input via an input device requesting rapid charging of the output capacitor. Rapid charging may include, for example, electrical charging that occurs at or above a predetermined rate (i.e., 5 watts of power per second), such that a charging rate below the predetermined rate may be considered non-rapid.

In block 306, if the rapid charging condition has been identified, then the controller may apply a linear mode voltage to the transistor, such as to a gate of the transistor. Application of the linear mode voltage to the transistor may cause the transistor to enter the linear mode and operate within the linear mode. In various embodiments, the controller may adjust operation of the transistor within the linear mode. For example, the controller may apply a first linear mode voltage to the transistor immediately after identifying the rapid charging condition (causing the transistor to allow a first transistor charging current to flow), and may apply a second linear mode voltage to the transistor after expiration of a period of time (causing the transistor to allow a second transistor charging current to flow), the second transistor charging current being different than the first transistor charging current.

In block 307, the controller may identify a fully charged condition. The fully charged condition may correspond to a condition in which an output capacitor is fully charged. For example, the controller may identify the fully charged condition based on data detected by a current sensor within the corresponding system. For example, if the current sensor detects a lack of current flowing from the power source, then the controller may identify that the fully charged condition has been entered.

In block 308, after the fully charged condition has been identified, the controller may apply an off mode voltage to a corresponding transistor. For example, the off mode voltage may be a voltage which causes the transistor to stop conducting between the collector and the emitter.

If the rapid charging condition in block 304 has not been identified, then a slow charging condition may be indicated. Stated differently, in response to a combination of initial power being provided by the power source and a lack of identification of rapid charging condition, the transistor may be controlled to be in an off mode in block 309. In that regard, the resister charging current alone will charge the output capacitor.

In block 310, a turn-on condition may be identified. The turn-on condition may correspond to a trigger or other indication that the load is turning on or is likely to turn-on within a predetermined amount of time. For example, the controller may be coupled to a power button of the load and may identify the turn-on condition in response to depression of the power button of the load.

In block 312, the controller may apply the on mode voltage to the transistor in response to identifying the turn-on condition. The on mode voltage may cause the transistor to operate in an on mode to allow the power source to provide the driving current to the load to power the load.

In block 314, the controller may identify a turn-off condition. The turn-off condition may include any data or indication that the load has stopped (or is likely to stop) drawing power. For example, the controller may be coupled to a power button of the load and may identify the turn-off condition in response to a second depression of the power button.

In block 316, the controller may apply the off mode voltage the transistor to cause the transistor to operate in the off mode.

Figure 3:
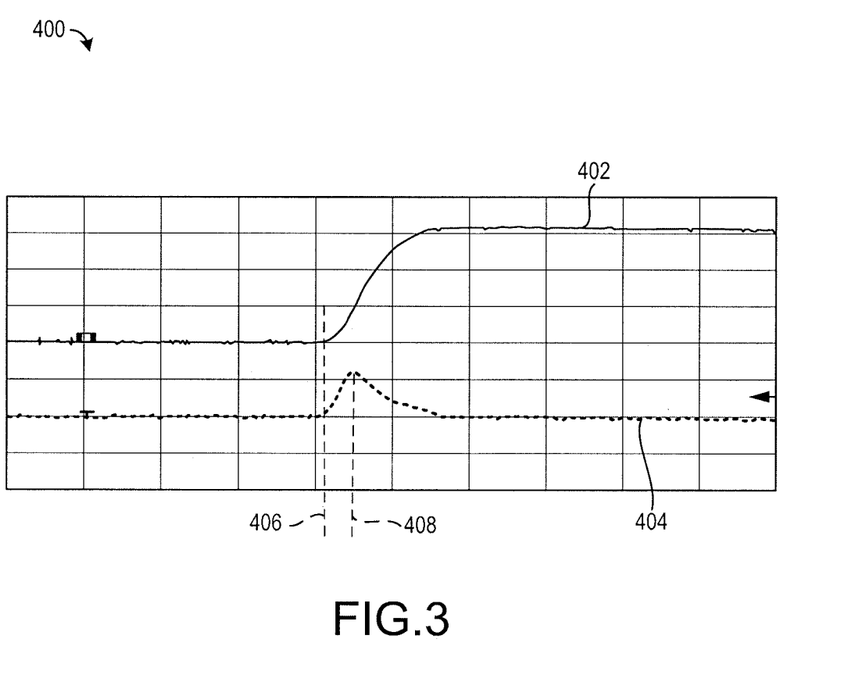
FIG. 3 illustrates results of an experiment using the system of FIG. 1, in accordance with various embodiments of the present disclosure.

Referring to FIGS. 1 and 3, a graph 400 illustrates exemplary results using the system 100 of FIG. 1. A first line 402 represents gate voltage (i.e., voltage applied to the gate 112 of the transistor 110) and a second line 404 illustrates inrush current experienced between the power source 102 and the load 104.

As shown at a first time 406, the gate voltage begins increasing relatively slowly. Simultaneously, or nearly simultaneously, the inrush current also begins increasing relatively slowly. As the gate voltage continues to ramp up, the inrush current reaches a peak value at a second time 408 and then begins decreasing as the gate voltage still continues to rise. Thus, the results illustrated in the graph 400 showed that the system 100 significantly limits inrush current during a power on event.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for controlling inrush current between a power source and a load, comprising:
    an output capacitor coupled in parallel with the load;
    a transistor having a gate, a collector configured to be coupled to the power source, and an emitter configured to be coupled to the load;
    a supply resistor having a first supply terminal directly electrically coupled to the collector of the transistor and a second supply terminal directly electrically coupled to the emitter of the transistor, the supply resistor being configured to provide a resistor charging current from the power source to the output capacitor to charge the output capacitor in response to initial power being provided by the power source;
    a gate resistor having a first terminal coupled to the gate of the transistor to facilitate operating the transistor in a linear mode;
    a current sensor configured to detect electrical current data corresponding to electrical current flowing from the power source; and
    a controller coupled to the gate of the transistor and the current sensor and configured to:
        identify the initial power being provided by the power source based on the detected electrical current data,
        cause the transistor to operate in a linear mode in response to the initial power being provided by the power source to increase a speed of charging the output capacitor,
        identify a turn-on condition in response to determining that the load at least one of will be or is turning on, and
        control the transistor to operate in an on mode to allow a driving current to flow through the transistor to power the load in response to identifying the turn-on condition.

2. The system of claim 1, wherein the gate resistor has a second terminal coupled to the controller, and wherein the controller is further configured to control the transistor to operate in the on mode by applying an on mode voltage to the gate of the transistor via the gate resistor.

3. The system of claim 2, wherein the controller is further configured to:
    identify a rapid charging condition in response to determining that rapid charging of the output capacitor is desirable; and
    control the transistor to operate in the linear mode by applying a linear mode voltage to the gate of the transistor via the gate resistor in response to identifying the rapid charging condition, the linear mode voltage being different than the on mode voltage.

4. The system of claim 1, wherein the controller is further configured to:
    identify a slow charging condition in response to determining that slow charging of the output capacitor is desirable; and
    control the transistor to operate in an off mode to reduce the likelihood of any current flowing from the power source through the transistor to the output capacitor in response to identifying the slow charging condition.

5. The system of claim 1, wherein the controller is further configured to:
    identify a turn-off condition in response to determining that the load at least one of will be or is turning off; and
    control the transistor to operate in an off mode or the linear mode to reduce the likelihood of the driving current flowing through the transistor to power the load in response to identifying the turn-off condition.

6. The system of claim 1, wherein the transistor is an insulated-gate bipolar transistor (IGBT).

7. The system of claim 1, wherein the supply resistor has a resistance value between 1 Kilo ohm and 1 Mega ohm.

8. The system of claim 1 wherein the output capacitor is a direct current (DC) link capacitor.

9. A system for controlling inrush current between a power source and a load, comprising:
    an output capacitor coupled in parallel with the load;
    a transistor having a gate, a collector configured to be coupled to the power source, and an emitter configured to be coupled to the load;
    a supply resistor having a first supply terminal directly electrically coupled to the collector of the transistor and a second supply terminal directly electrically coupled to the emitter of the transistor, the supply resistor being configured to provide a resistor charging current from the power source to the output capacitor to charge the output capacitor in response to initial power being provided by the power source;

a gate resistor having a first terminal coupled to the gate of the transistor;

a current sensor configured to detect electrical current data corresponding to electrical current flowing from the power source; and a controller coupled to the transistor and the current sensor and configured to:
identify the initial power being provided by the power source based on the detected electrical current data,
identify a rapid charging condition in response to determining that rapid charging of the output capacitor is desirable; and
control the transistor to operate in a linear mode in response identifying the rapid charging condition and in response to the initial power being provided by the power source to increase a speed of charging the output capacitor.

10. The system of claim 9, wherein the gate resistor has a second terminal coupled to the controller, and the controller is further configured to control the transistor to operate in the linear mode by applying a linear mode voltage to the gate of the transistor via the gate resistor.

11. The system of claim 9 wherein the controller is further configured to:
identify a turn-on condition in response to determining that the load at least one of will be or is turning on; and
control the transistor to operate in an on mode to allow a driving current to flow through the transistor to power the load in response to identifying the turn-on condition.

12. The system of claim 11 wherein the controller is further configured to:
identify a turn-off condition in response to determining that the load at least one of will be or is turning off; and
control the transistor to operate in an off mode or the linear mode to reduce the likelihood of the driving current flowing through the transistor to power the load in response to identifying the turn-off condition.

13. The system of claim 11 wherein the gate resistor has a second terminal coupled to the controller, and the controller is further configured to control the transistor to operate in the on mode by applying an on mode voltage to the gate of the transistor via the gate resistor.

14. The system of claim 9 wherein the controller is further configured to:
identify a slow charging condition in response to determining that slow charging of the output capacitor is desirable; and
control the transistor to operate in an off mode to reduce the likelihood of any current flowing from the power source through the transistor to the output capacitor in response to identifying the slow charging condition.

15. A method for controlling inrush current between a power source and a load, the method comprising:

detecting, by a current sensor, electrical current data corresponding to electrical current flowing from the power source;

identifying, by a controller, initial power being provided by the power source based on the electrical current data;

identifying, by the controller, a rapid charging condition in response to determining that rapid charging of an output capacitor coupled to the load is desirable;

controlling, by the controller, a transistor coupled between the power source and the load to operate in a linear mode to provide a transistor charging current from the power source to the output capacitor in response to at least one of the initial power being provided by the power source or a combination of the initial power being provided by the power source and determining that rapid charging of the output capacitor is desirable;

identifying, by the controller, a turn-on condition in response to determining that the load at least one of will be or is turning on; and controlling, by the controller, the transistor to operate in an on mode to allow driving current to flow through the transistor to power the load in response to identifying the turn-on condition, the driving current being greater than the transistor charging current, wherein a supply resistor has a first supply terminal directly coupled to a collector of the transistor and a second supply terminal directly coupled to an emitter of the transistor.

16. The method of claim 15, further comprising:
identifying, by the controller, a slow charging condition in response to determining that slow charging of the output capacitor is desirable; and
controlling, by the controller, the transistor to operate in an off mode such that the total charging current is provided by the resistor charging current.

17. The method of claim 15, further comprising:
identifying, by the controller, a turn-off condition in response to determining that the load at least one of will be or is turning off; and
controlling, by the controller, the transistor to operate in an off mode or the linear mode to reduce the likelihood of the driving current flowing through the transistor to power the load in response to identifying the turn-off condition.

18. The method of claim 15 further comprising:
identifying, by the controller, a fully charged condition in response to determining that the output capacitor is fully charged; and
controlling, by the controller, the transistor to operate in an off mode in response to identifying the fully charged condition.

* * * * *